United States Patent
Ding et al.

(10) Patent No.: US 12,133,354 B2
(45) Date of Patent: Oct. 29, 2024

(54) AIRFLOW GUIDING MECHANISM AND ELECTRONIC DEVICE

(71) Applicant: Wiwynn Corporation, New Taipei (TW)

(72) Inventors: Yuan-Shiang Ding, New Taipei (TW); Geng-Ting Liu, New Taipei (TW)

(73) Assignee: Wiwynn Corporation, New Taipei (TW)

( * ) Notice: Subject to any disclaimer, the term of this patent is extended or adjusted under 35 U.S.C. 154(b) by 190 days.

(21) Appl. No.: 17/878,080

(22) Filed: Aug. 1, 2022

(65) Prior Publication Data

US 2024/0015919 A1 Jan. 11, 2024

(30) Foreign Application Priority Data

Jul. 8, 2022 (TW) .................................. 111125664

(51) Int. Cl.
 *H05K 7/20* (2006.01)
(52) U.S. Cl.
 CPC ................................ *H05K 7/20145* (2013.01)
(58) Field of Classification Search
 CPC .. G06F 1/20; H05K 7/20145; H05K 7/20172; H05K 7/20; H05K 7/20736; H05K 7/20136; H05K 7/20727; H05K 7/20209; H05K 7/20181
 See application file for complete search history.

(56) References Cited

U.S. PATENT DOCUMENTS

| | | | |
|---|---|---|---|
| 6,181,557 B1* | 1/2001 | Gatti | H05K 7/20618 361/679.48 |
| 8,057,161 B2* | 11/2011 | Seidler | F04D 29/703 415/26 |
| 2005/0063822 A1* | 3/2005 | Horng | F04D 19/002 257/E23.099 |
| 2006/0152901 A1* | 7/2006 | Espinoza-Ibarra | F04D 25/0613 361/695 |
| 2007/0242431 A1* | 10/2007 | Kuo | H01L 23/467 257/E23.099 |
| 2008/0151490 A1* | 6/2008 | Fan | G06F 1/20 361/690 |
| 2009/0016019 A1* | 1/2009 | Bandholz | H05K 7/20736 361/695 |
| 2013/0044430 A1* | 2/2013 | Carl, Jr. | H05K 7/20172 361/695 |
| 2013/0258590 A1* | 10/2013 | Sun | H05K 7/20172 361/695 |

(Continued)

FOREIGN PATENT DOCUMENTS

CN 206602759 U 10/2017
TW 1763293 B 5/2022

*Primary Examiner* — Adam B Dravininkas
(74) *Attorney, Agent, or Firm* — Winston Hsu

(57) ABSTRACT

An airflow guiding mechanism includes a casing and an airflow guiding member. The airflow guiding member is rotatably disposed in the casing. The airflow guiding member is able to rotate between a first position and a second position. When the airflow guiding member is located at the first position, the airflow guiding member separates two airflow passages at opposite sides of the airflow guiding member from each other. When the airflow guiding member is located at the second position, the two airflow passages communicate with each other.

12 Claims, 10 Drawing Sheets

(56) References Cited

U.S. PATENT DOCUMENTS

| | | | |
|---|---|---|---|
| 2013/0324025 A1* | 12/2013 | Peng | H05K 5/0213 |
| | | | 415/223 |
| 2019/0301489 A1* | 10/2019 | Chen | F04D 19/002 |
| 2022/0097490 A1* | 3/2022 | Zhang | B60H 1/3421 |
| 2022/0107096 A1* | 4/2022 | Yuan | F24F 13/1413 |

\* cited by examiner

AIRFLOW GUIDING MECHANISM AND ELECTRONIC DEVICE

BACKGROUND OF THE INVENTION

1. Field of the Invention

The invention relates to an airflow guiding mechanism and, more particularly, to an airflow guiding mechanism capable of effectively improving airflow noise and an electronic device equipped with the airflow guiding mechanism.

2. Description of the Prior Art

As technology advances and develops, various electronic devices (e.g. computer, server, etc.) are considered a necessity by a lot of people in their daily lives. In general, the electronic device is equipped with a hard disk and a fan for dissipating heat from the hard disk. However, the airflow noise generated by the fan will affect the read/write performance of the hard disk, thereby degrading the performance of the hard disk.

SUMMARY OF THE INVENTION

According to an embodiment of the invention, an airflow guiding mechanism comprises a casing and an airflow guiding member. The airflow guiding member is rotatably disposed in the casing. The airflow guiding member is able to rotate between a first position and a second position. When the airflow guiding member is located at the first position, the airflow guiding member separates two airflow passages at opposite sides of the airflow guiding member from each other. When the airflow guiding member is located at the second position, the two airflow passages communicate with each other.

According to another embodiment of the invention, an electronic device comprises an electronic unit, two airflow generating units and an airflow guiding mechanism. The two airflow generating units are disposed with respect to the electronic unit. The airflow guiding mechanism is disposed between the electronic unit and the two airflow generating units. The airflow guiding mechanism comprises a casing and an airflow guiding member. The airflow guiding member is rotatably disposed in the casing. The airflow guiding member is able to rotate between a first position and a second position. When the airflow guiding member is located at the first position, the airflow guiding member separates two airflow passages at opposite sides of the airflow guiding member from each other. When the airflow guiding member is located at the second position, the two airflow passages communicate with each other. Each of the two airflow passages corresponds to one of the two airflow generating units.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
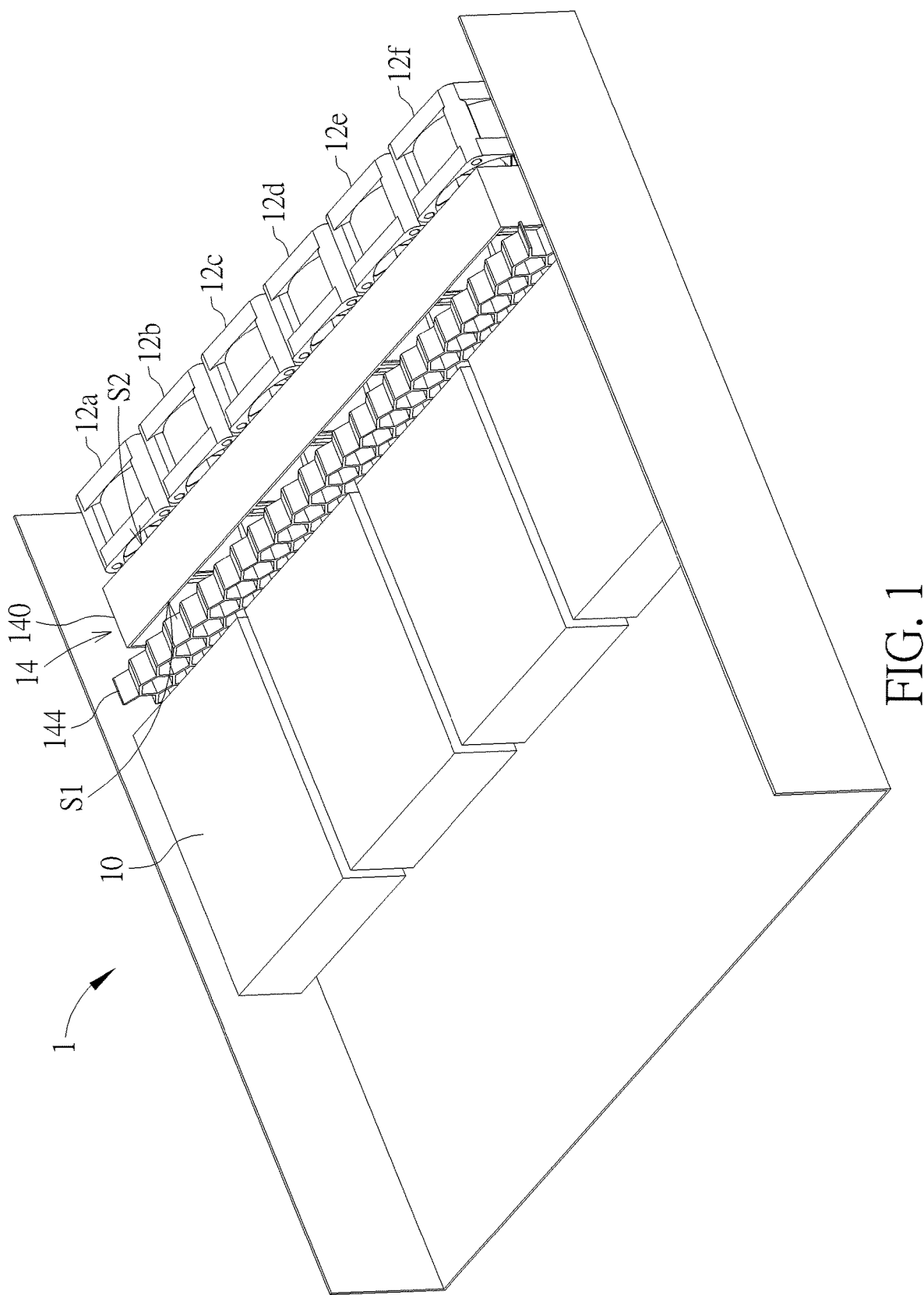
FIG. 1 is an inside perspective view illustrating an electronic device according to an embodiment of the invention.
Figure 2:
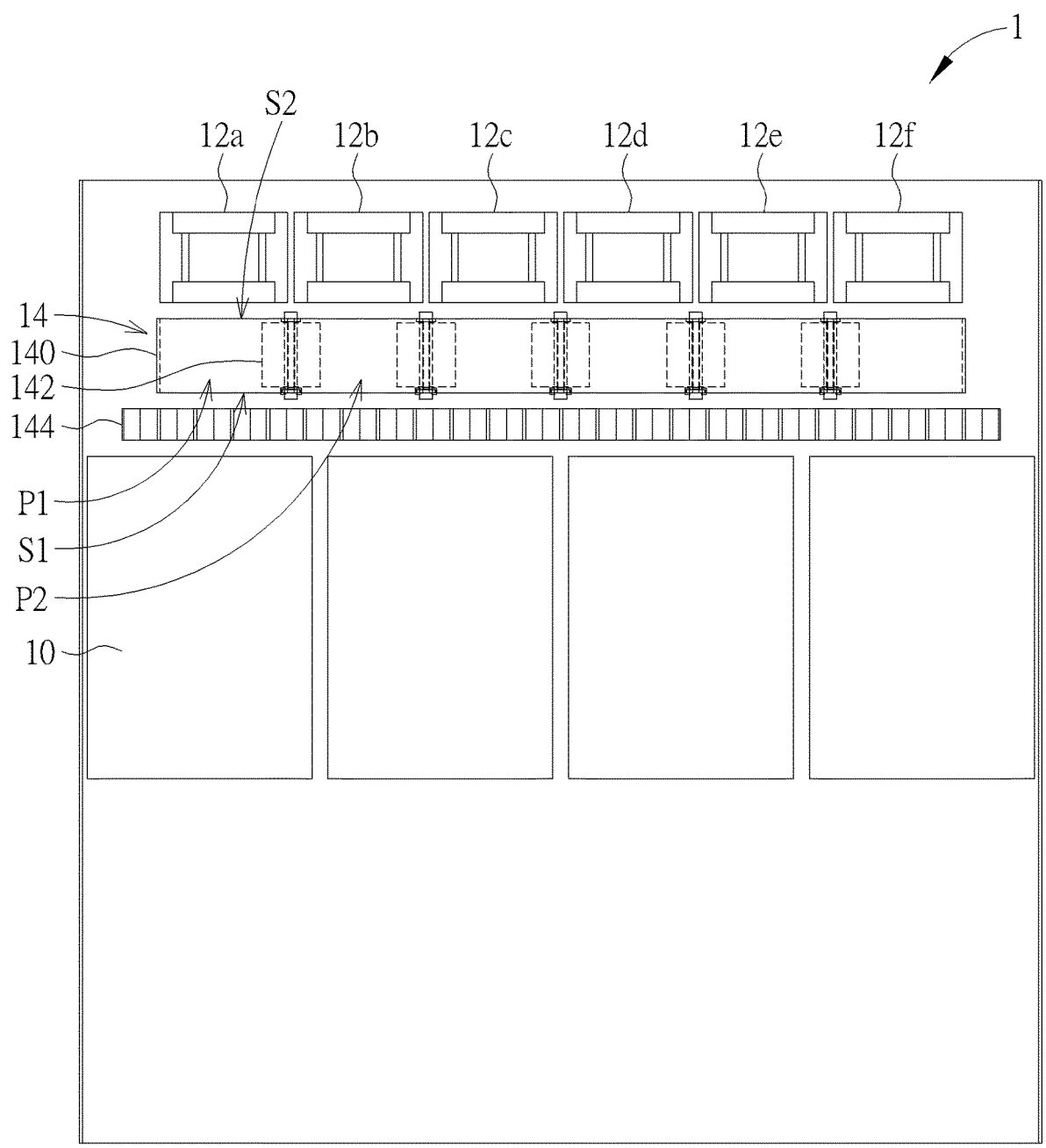
FIG. 2 is a top view illustrating the electronic device shown in FIG. 1.
Figure 3:
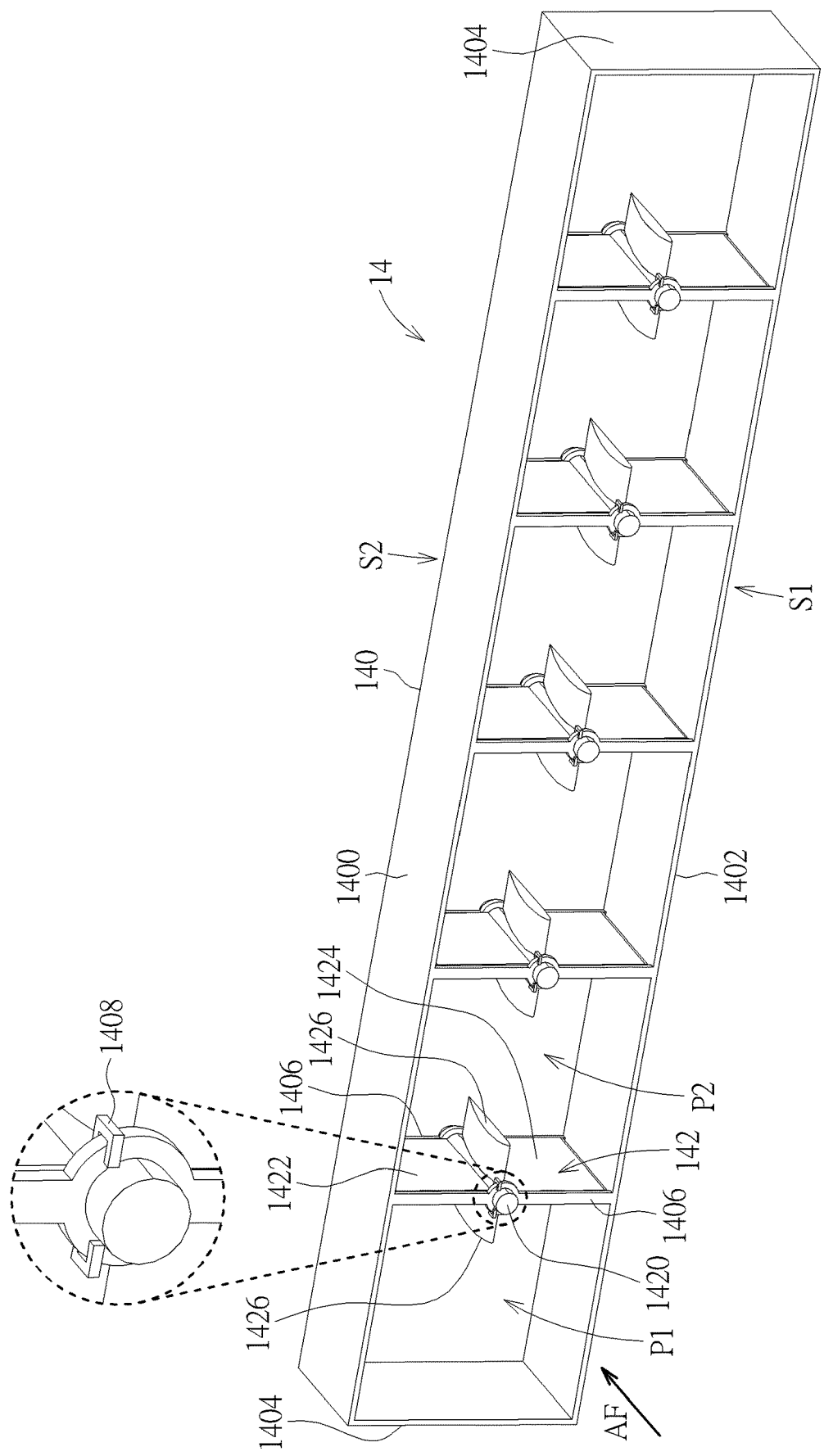
FIG. 3 is a perspective view illustrating an airflow guiding mechanism shown in FIG. 1.
Figure 4:
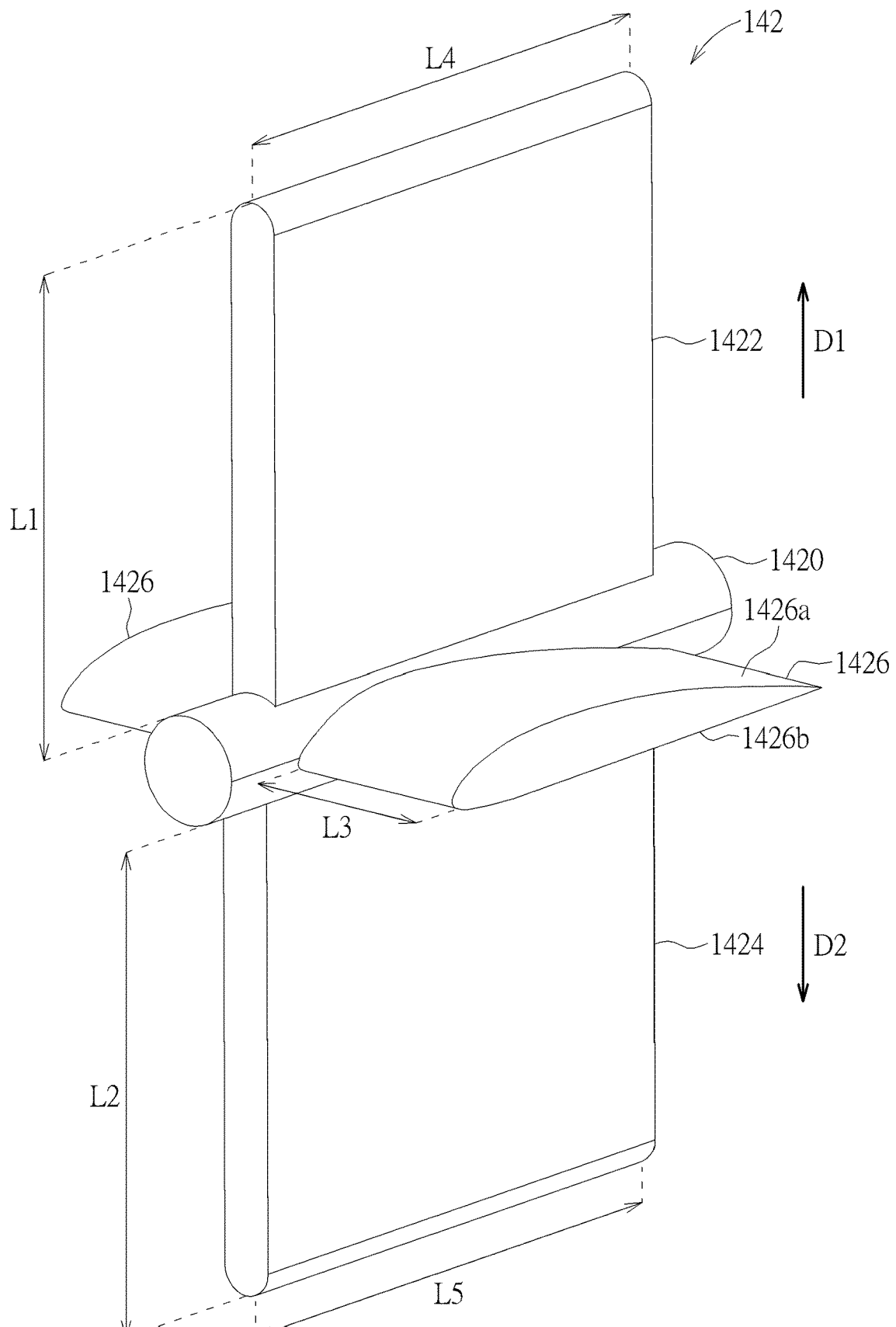
FIG. 4 is a perspective view illustrating an airflow guiding member shown in FIG. 3.
Figure 5:
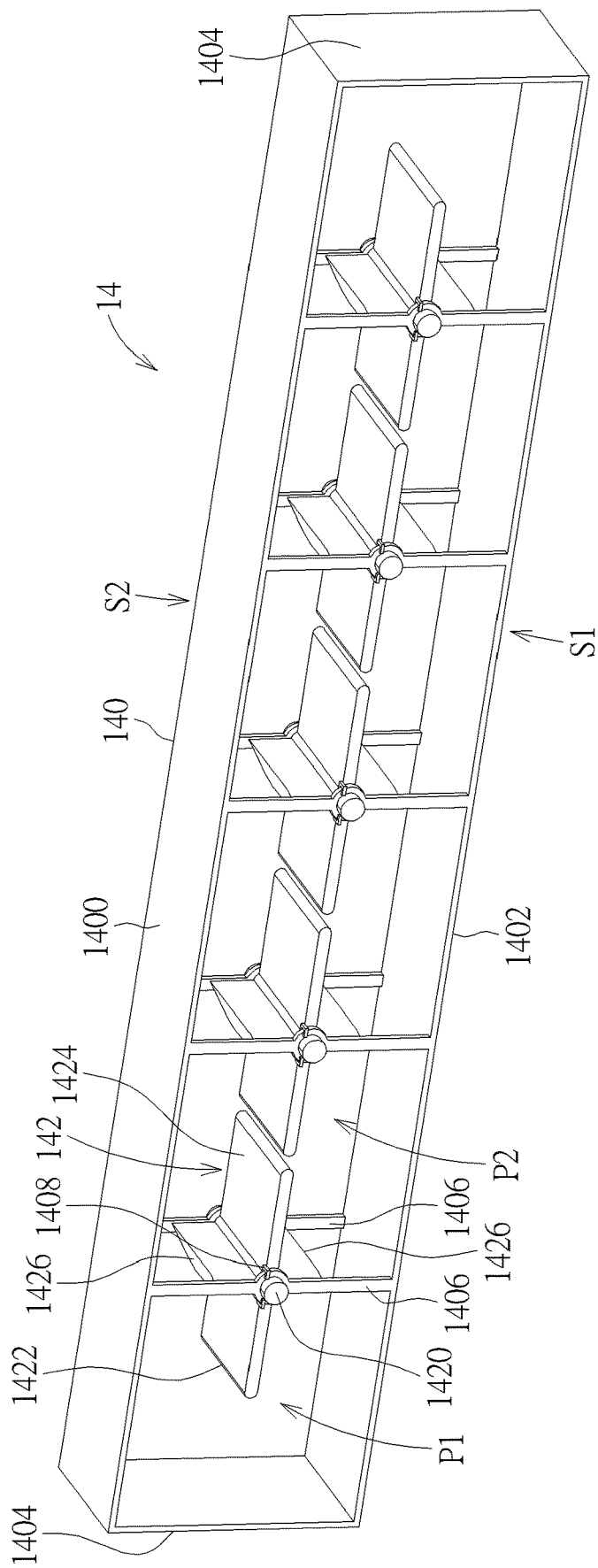
FIG. 5 is a perspective view illustrating the airflow guiding member shown in FIG. 3 rotating from a first position to a second position.
Figure 6:
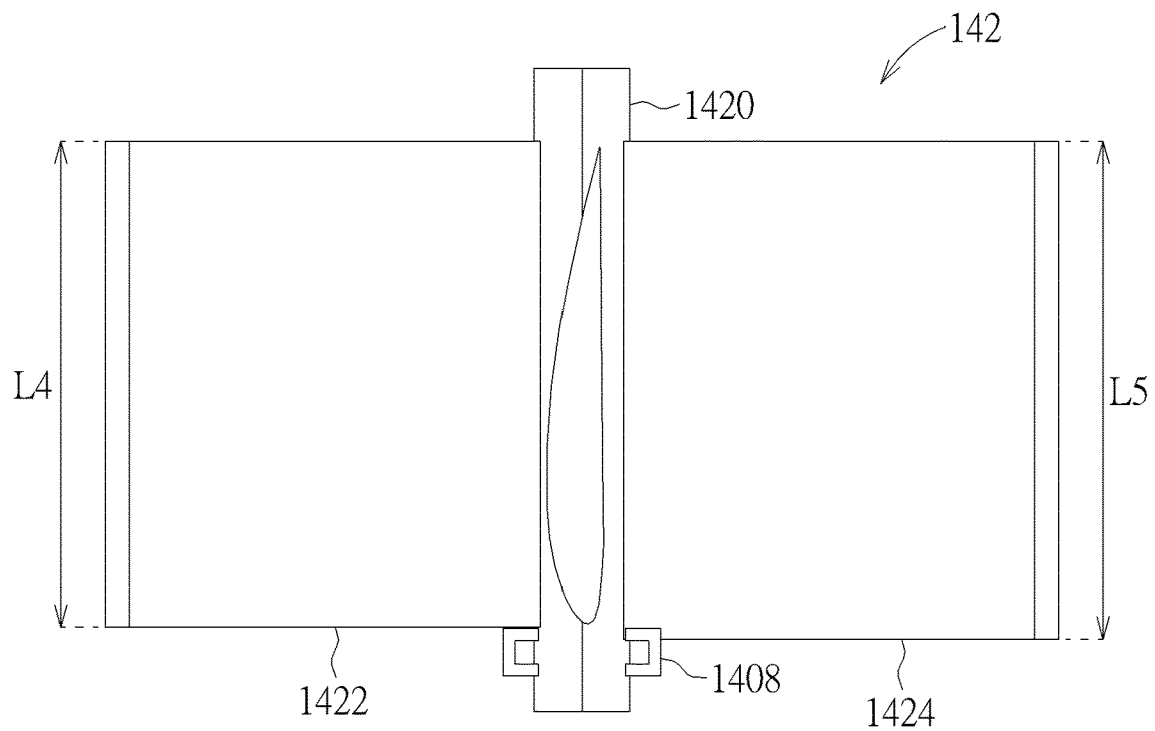
FIG. 6 is a top view illustrating the airflow guiding member and a stop structure shown in FIG. 5.

Referring to FIGS. 1 to 6, FIG. 1 is an inside perspective view illustrating an electronic device 1 according to an embodiment of the invention, FIG. 2 is a top view illustrating the electronic device 1 shown in FIG. 1, FIG. 3 is a perspective view illustrating an airflow guiding mechanism 14 shown in FIG. 1, FIG. 4 is a perspective view illustrating an airflow guiding member 142 shown in FIG. 3, FIG. 5 is a perspective view illustrating the airflow guiding member 142 shown in FIG. 3 rotating from a first position to a second position, and FIG. 6 is a top view illustrating the airflow guiding member 142 and a stop structure 1408 shown in FIG. 5.

As shown in FIG. 1, the electronic device 1 comprises an electronic unit 10, two airflow generating units 12a, 12b and an airflow guiding mechanism 14. The two airflow generating units 12a, 12b are disposed with respect to the electronic unit 10, and the airflow guiding mechanism 14 is disposed between the electronic unit 10 and the two airflow generating units 12a, 12b. The airflow generating units 12a, 12b are used to generate airflow to dissipate heat from the electronic unit 10. The airflow guiding mechanism 14 is used to improve the airflow noise generated by the airflow generating units 12a, 12b, so as to prevent the performance of the electronic unit 10 from being degraded by the airflow noise. The electronic device 1 may be a computer, a server or other electronic devices according to practical applications. In general, the electronic device 1 may be further equipped with some necessary hardware and/or software components for specific purposes, such as processor, memory, power supply, applications, communication module, etc., and it depends on practical applications. In this embodiment, the electronic unit 10 may be a hard disk and the airflow generating units 12a, 12b may be fans, but the invention is not so limited.

It should be noted that the number of the electronic units and the airflow generating units may be determined according to practical applications, so the invention is not limited to the embodiment shown in the figure. For further explanation, the number of the electronic units may be one or more, and the number of the airflow generating units may be at least two. For example, as shown in FIGS. 1 and 2, the electronic device 1 may comprise four electronic units 10 and six airflow generating units 12a-12f, wherein the aforesaid two airflow generating units 12a, 12b are two of the six airflow generating units 12a-12f.

As shown in FIGS. 2 and 3, the airflow guiding mechanism 14 comprises a casing 140 and an airflow guiding member 142. The airflow guiding member 142 is rotatably disposed in the casing 140, such that the airflow guiding member 142 is able to rotate between a first position (as shown in FIG. 3) and a second position (as shown in FIG. 5). It should be noted that the number of the airflow guiding members may be determined according to practical applications, so the invention is not limited to the embodiment shown in the figure. For further explanation, the number of the airflow guiding members may be one or more. For example, as shown in FIGS. 2 and 3, the airflow guiding mechanism 14 may comprise five airflow guiding members 142, wherein each of the airflow guiding members 142 is located between two of the six airflow generating units 12a-12f.

As shown in FIGS. 3 and 4, the airflow guiding member 142 comprises a rotating shaft 1420, a first blade 1422, a second blade 1424 and two third blades 1426. The rotating shaft 1420 is pivotally connected to the casing 140 and substantially parallel to a flowing direction AF of an airflow generated by the airflow generating units 12a, 12b. In this embodiment, the casing 140 may define an air inlet side S1 and an air outlet side S2, wherein the air inlet side S1 is opposite to the air outlet side S2. The airflow generated by the airflow generating units 12a, 12b may flow from the air inlet side S1 toward the air outlet side S2. Thus, the flowing direction AF of the airflow is a direction from the air inlet side S1 toward the air outlet side S2. In this embodiment, the casing 140 may comprise an upper plate 1400, a lower plate 1402 and two side plates 1404, wherein the two side plates 1404 connect the upper plate 1400 and the lower plate 1402, such that the casing 140 is in the shape of a rectangle. Furthermore, for each of the airflow guiding members 142, the air inlet side S1 and the air outlet side S2 of the casing 140 may further comprise two pivot structures 1406 connected to the upper plate 1400 and the lower plate 1402. In this embodiment, each of the pivot structures 1406 may be a pillar with a pivot hole. Opposite ends of the rotating shaft 1420 are pivotally connected to the two pivot structures 1406, such that the airflow guiding member 142 is rotatably disposed in the casing 140. When the rotating shaft 1420 is pivotally connected to the two pivot structures 1406, the rotating shaft 1420 is substantially parallel to the upper plate 1400 and the lower plate 1402. It should be noted that the definition of the aforesaid "substantially parallel" includes the case where the rotating shaft 1420 is slightly skewed.

As shown in FIG. 4, the first blade 1422 and the second blade 1424 are connected to opposite sides of the rotating shaft 1420, and the two third blades 1426 are also connected to opposite sides of the rotating shaft 1420, such that the airflow guiding member 142 is in the shape of a cross. In this embodiment, lengths L3 of the two third blades 1426 in a radial direction of the rotating shaft 1420 are smaller than lengths L1, L2 of the first blade 1422 and the second blade 1424 in the radial direction of the rotating shaft 1420. Furthermore, a length L4 of the first blade 1422 in an axial direction of the rotating shaft 1420 is smaller than a length L5 of the second blade 1424 in the axial direction of the rotating shaft 1420, and a mass of the first blade 1422 is less than a mass of the second blade 1424. Accordingly, an overall center of gravity of the airflow guiding member 142 is lower than an axial center of the rotating shaft 1420. In a natural state without external force, the airflow guiding member 142 will be kept at the first position shown in FIG. 3. It should be noted that the invention may also change the mass of the first blade 1422 and the second blade 1424 by changing the materials of the first blade 1422 and the second blade 1424, thereby resulting in that the overall center of gravity of the airflow guiding member 142 is lower than the axial center of the rotating shaft 1420.

In this embodiment, each of the two third blades 1426 has a curved surface 1426a and a flat surface 1426b, wherein the curved surface 1426a faces a direction D1 of the first blade 1422 and the flat surface 1426b faces a direction D2 of the second blade 1424. When the airflow flows through each of the third blades 1426, the pressure below the flat surface 1426b will be higher than the pressure above the curved surface 1426a. At this time, the pressure difference will generate a lifting force on the third blade 1426. It should be noted that the structure and size of the third blade 1426 may be designed according to the principles of fluid mechanics, such that the pressure difference is generated at opposite sides of the third blade 1426. However, the invention is not limited to the structure and size of this embodiment and the explanation will not be depicted herein.

In the following, the two airflow generating units 12a, 12b and the corresponding airflow guiding member 142 are used to depict the technical feature of the disclosure. When the two airflow generating units 12a, 12b operate normally, the airflow generated by the two airflow generating units 12a, 12b will uniformly flow through opposite sides of the airflow guiding member 142. At this time, the moment caused by the lifting force to the two third blades 1426 will cancel each other out, such that the airflow guiding member 142 is kept at the first position shown in FIG. 3 without rotating. When the airflow guiding member 142 is located at the first position shown in FIG. 3, the first blade 1422 and the second blade 1424 of the airflow guiding member 142 separates two airflow passages P1, P2 at opposite sides of the airflow guiding member 142 from each other, wherein each of the two airflow passages P1, P2 corresponds to one of the two airflow generating units 12a, 12b. At this time, the airflow generated by the two airflow generating units 12a, 12b will be separated by the airflow guiding member 142, so as to prevent the airflow noise generated by the two airflow generating units 12a, 12b from interfering with each other. Accordingly, the disclosure can achieve the effects of airflow adjustment and noise reduction to prevent the performance of the electronic unit 10 from being degraded by the airflow noise.

Furthermore, when one of the two airflow generating units 12a, 12b operates abnormally, the airflow generated by the two airflow generating units 12a, 12b will deflect to one side of the airflow guiding member 142. For example, when the airflow generating unit 12a operates abnormally, the airflow will deflect to the right side of the airflow guiding member 142. At this time, the moment caused by the lifting force to the third blade 1426 at the right side cannot be balanced, such that the airflow guiding member 142 will rotate counterclockwise to the second position shown in FIG. 5. When the airflow guiding member 142 is located at the second position shown in FIG. 5, the two airflow passages P1, P2 communicate with each other through the two third blades 1426, such that the airflow generated by the airflow generating unit 12b, which operates normally, may flow through the two airflow passages P1, P2 to dissipate heat from the electronic unit 10. Accordingly, the disclosure can prevent the heat dissipation efficiency from being greatly reduced due to the abnormal operation of the airflow generating unit 12a. Similarly, when the airflow deflects to the left side of the airflow guiding member 142 shown in FIG. 3, the airflow guiding member 142 will rotate clockwise to another second position opposite to the second position shown in FIG. 5, such that the two airflow passages P1, P2 communicate with each other through the two third blades 1426.

In some embodiments, when airflows in two airflow passages P1, P2 at opposite sides of the airflow guiding member 142 are not uniform (e.g., when one of the two airflow generating units 12a, 12b adjacent to the airflow guiding member 142 operates abnormally), the airflow guiding member 142 is blew by the airflow to rotate to the second position therefore allows the two airflow passages P1, P2 to communicate with each other. When two airflows in the two airflow passages P1, P2 are uniform (e.g., when the two airflow generating units 12a, 12b adjacent to the airflow guiding member 142 operate normally), the airflow guiding member 142 is blew to and kept at the first position therefore separates the two airflow passages P1, P2 from each other.

As shown in FIGS. 5 and 6, the casing 140 may have a stop structure 1408, wherein the stop structure 1408 may be located at a pivotal joint of the rotating shaft 1420 and the pivot structure 1406. When the airflow guiding member 142 is located at the second position shown in FIGS. 5 and 6, the stop structure 1408 will stop the second blade 1424 to restrain the airflow guiding member 142 from rotating. Since the length L4 of the first blade 1422 in the axial direction of the rotating shaft 1420 is smaller than the length L5 of the second blade 1424 in the axial direction of the rotating shaft 1420, the first blade 1422 will not touch the stop structure 1408 during rotation.

In this embodiment, a plurality of airflow guiding members 142 are disposed in the casing 140. In some embodiments, when one of the airflow guiding members 142 rotates to the second position due to the variation of the airflow, other airflow guiding members 142 may also rotate to the second position due to the variation of the airflow (as shown in FIG. 5), such that the airflow may be distributed to all of the electronic units 10 more uniformly.

As shown in FIGS. 1 and 2, the airflow guiding mechanism 14 may further comprise a porous structure 144 disposed at the air inlet side S1 of the casing 140 and located between the electronic unit 10 and the casing 140. The porous structure 144 is used to stabilize the airflow flowing into the casing 140, so as to prevent the airflow guiding member 142 from rotating due to unstable airflow. In this embodiment, the porous structure 144 may be a honeycomb-shaped filter or other structures capable of stabilizing the airflow according to practical applications. In another embodiment, the porous structure 144 may also be omitted.

Figure 7:
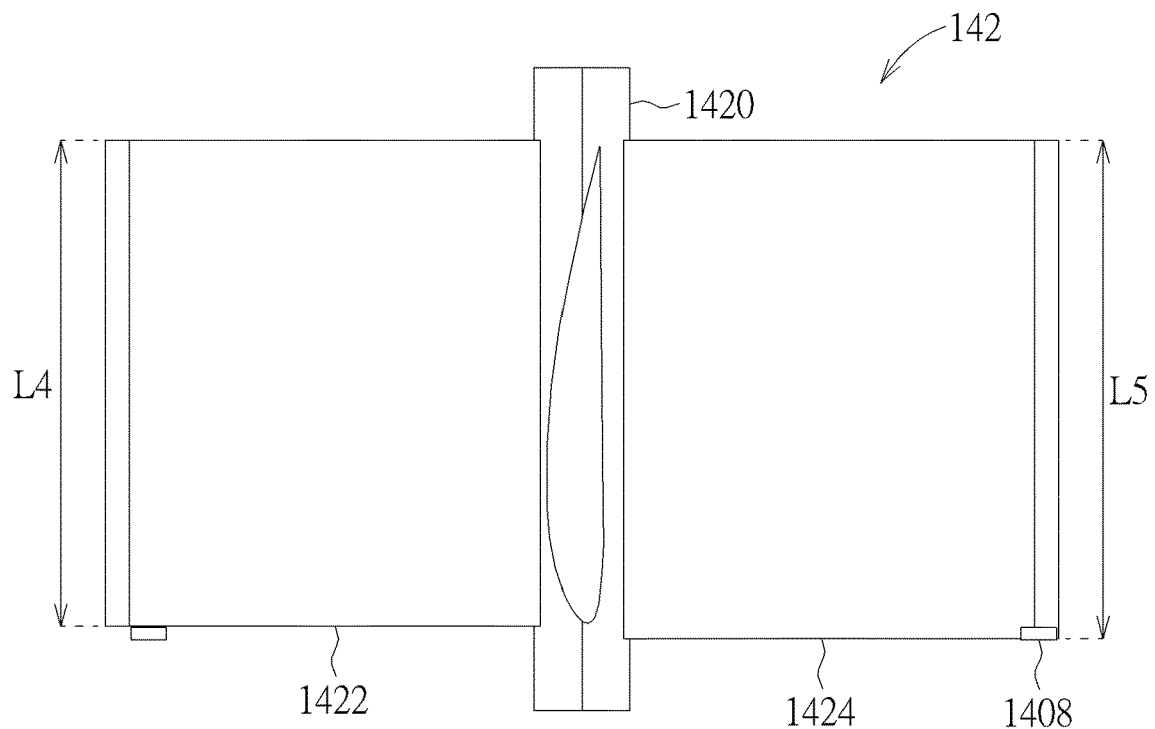
FIG. 7 is a top view illustrating the airflow guiding member and the stop structure according to another embodiment of the invention.

Referring to FIG. 7, FIG. 7 is a top view illustrating the airflow guiding member 142 and the stop structure 1408 according to another embodiment of the invention. As shown in FIG. 7, by means of appropriate structural design, the stop structure 1408 may also be located at a position corresponding to an end of the second blade 1424. When the airflow guiding member 142 is located at the second position shown in FIG. 7, the stop structure 1408 will stop the second blade 1424 to restrain the airflow guiding member 142 from rotating.

Figure 8:
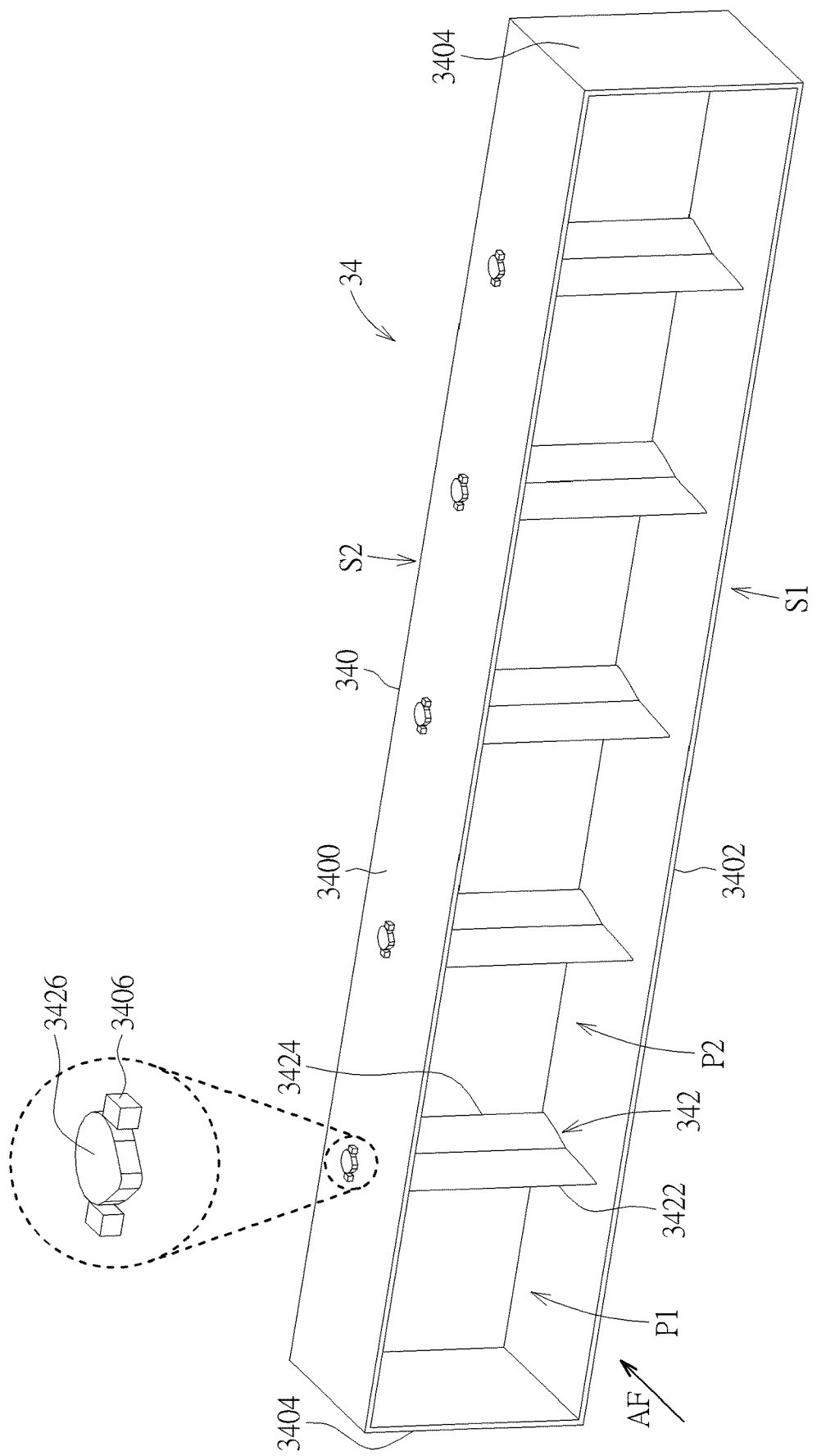
FIG. 8 is a perspective view illustrating an airflow guiding mechanism according to another embodiment of the invention.
Figure 9:
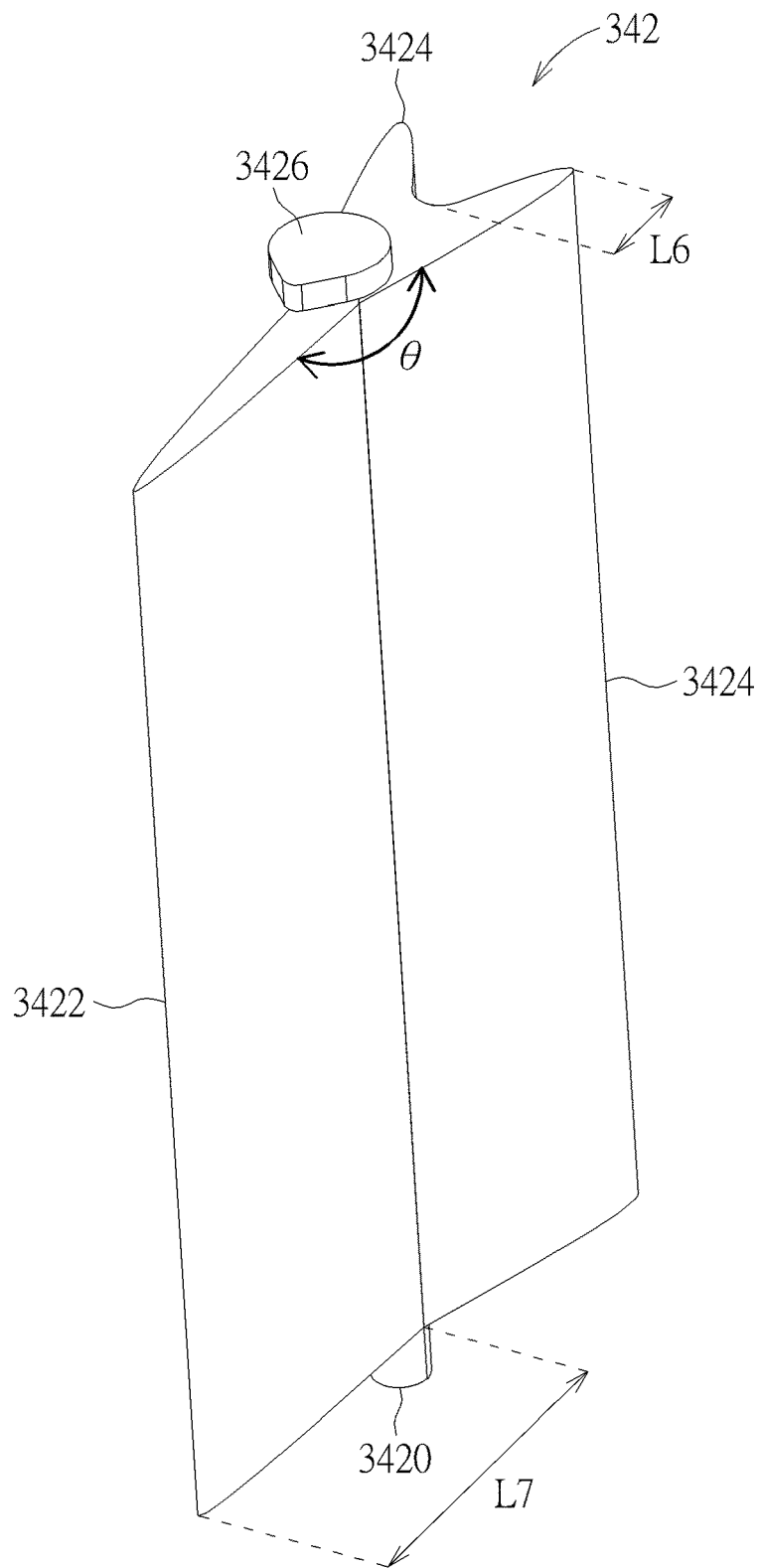
FIG. 9 is a perspective view illustrating an airflow guiding member shown in FIG. 8.
Figure 10:
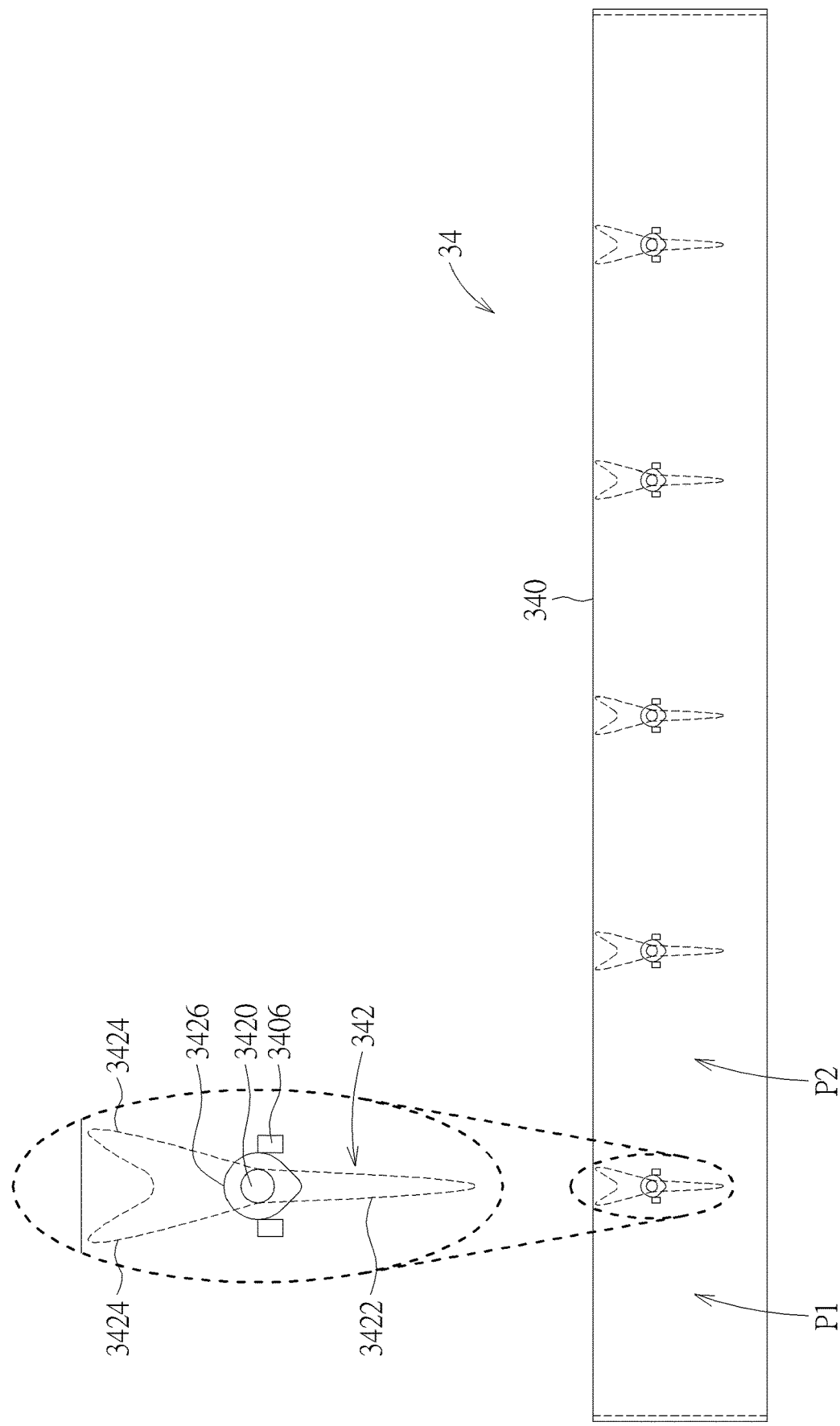
FIG. 10 is a top view illustrating the airflow guiding mechanism shown in FIG. 8.
Figure 11:
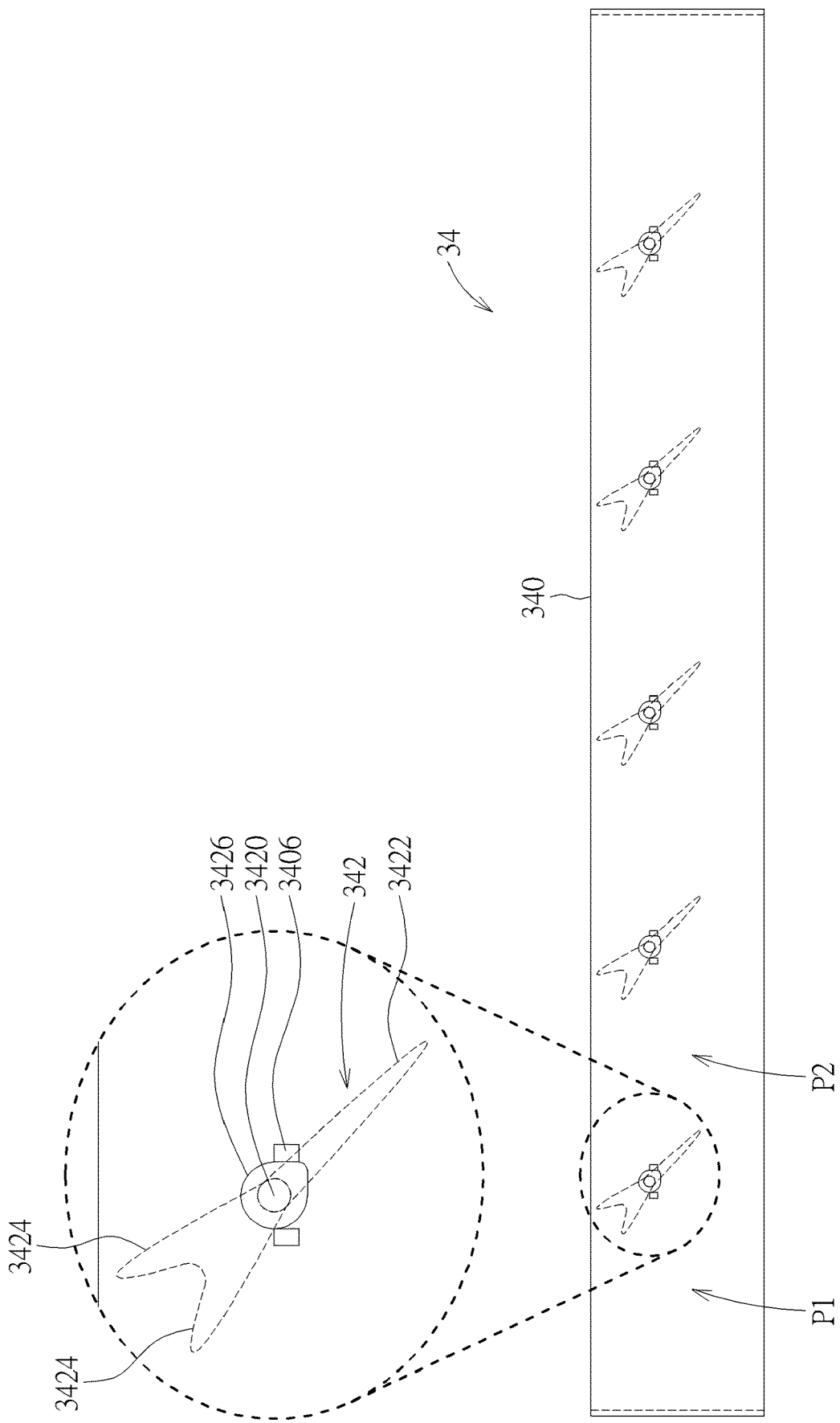
FIG. 11 is a top view illustrating the airflow guiding member shown in FIG. 10 rotating from a first position to a second position.

Referring to FIGS. 8 to 11, FIG. 8 is a perspective view illustrating an airflow guiding mechanism 34 according to another embodiment of the invention, FIG. 9 is a perspective view illustrating an airflow guiding member 342 shown in FIG. 8, FIG. 10 is a top view illustrating the airflow guiding mechanism 34 shown in FIG. 8, and FIG. 11 is a top view illustrating the airflow guiding member 342 shown in FIG. 10 rotating from a first position to a second position.

As shown in FIG. 8, the airflow guiding mechanism 34 comprises a casing 340 and an airflow guiding member 342. The airflow guiding member 342 is rotatably disposed in the casing 340, such that the airflow guiding member 342 is able to rotate between a first position (as shown in FIG. 10) and a second position (as shown in FIG. 11). The airflow guiding mechanism 14 shown in FIG. 1 may be replaced by the airflow guiding mechanism 34 shown in FIG. 8, and the porous structure 144 may also be disposed at an air inlet side S1 of the casing 340 of the airflow guiding mechanism 34. It should be noted that the number of the airflow guiding members may be determined according to practical applications, so the invention is not limited to the embodiment shown in the figure. For further explanation, the number of the airflow guiding members may be one or more. For example, as shown in FIG. 8, the airflow guiding mechanism 34 may comprise five airflow guiding members 342.

As shown in FIGS. 8 and 9, the airflow guiding member 342 comprises a rotating shaft 3420, a first blade 3422 and two second blades 3424. The rotating shaft 3420 is pivotally connected to the casing 340 and substantially perpendicular to a flowing direction AF of an airflow generated by the airflow generating units 12a, 12b. In this embodiment, the casing 340 may define an air inlet side S1 and an air outlet side S2, wherein the air inlet side S1 is opposite to the air outlet side S2. The airflow generated by the airflow generating units 12a, 12b may flow from the air inlet side S1 toward the air outlet side S2. Thus, the flowing direction AF of the airflow is a direction from the air inlet side S1 toward the air outlet side S2. In this embodiment, the casing 340 may comprise an upper plate 3400, a lower plate 3402 and two side plates 3404, wherein the two side plates 3404 connect the upper plate 3400 and the lower plate 3402, such that the casing 340 is in the shape of a rectangle. Opposite ends of the rotating shaft 3420 may be pivotally connected to the upper plate 3400 and the lower plate 3402, such that the airflow guiding member 342 is rotatably disposed in the casing 340. When the rotating shaft 3420 is pivotally connected to the upper plate 3400 and the lower plate 3402, the rotating shaft 3420 is substantially perpendicular to the upper plate 3400 and the lower plate 3402. It should be noted that the definition of the aforesaid "substantially perpendicular" includes the case where the rotating shaft 3420 is slightly skewed.

As shown in FIG. 9, the first blade 3422 and the two second blades 3424 extend from the rotating shaft 3420, wherein the two second blades 3424 are symmetrically located at opposite sides of an end of the first blade 3422. In this embodiment, the first blade 3422 and the two second blades 3424 may be integrally formed to be a blade structure, such that the blade structure may be directly sleeved on the rotating shaft 3420. In another embodiment, the first blade 3422 and the two second blades 3424 may also be independent components according to practical applications. In this embodiment, lengths L6 of the two second blades 3424 in a radial direction of the rotating shaft 3420 are smaller than a length L7 of the first blade 3422 in the radial direction of the rotating shaft 3420. In this embodiment, an included angle θ between each of the second blades 3424 and the first blade 3422 is larger than, but is not limited to, 90 degrees. The included angle θ between each of the second blades 3424 and the first blade 3422 may be designed according to the principles of fluid mechanics and the explanation will not be depicted herein.

In the following, the two airflow generating units 12a, 12b (as shown in FIG. 1) and the corresponding airflow guiding member 342 (as shown in FIGS. 10 and 11) are used to depict the technical feature of the disclosure. When the two airflow generating units 12a, 12b operate normally, the airflow generated by the two airflow generating units 12a, 12b will uniformly flow through opposite sides of the airflow guiding member 342. At this time, the moment caused by the pushing force of the airflow to the two second blades 3424 will cancel each other out, such that the airflow guiding member 342 is kept at the first position shown in FIG. 10 without rotating. When the airflow guiding member 342 is located at the first position shown in FIG. 10, the first blade 3422 and the two second blades 3424 of the airflow guiding member 342 separates two airflow passages P1, P2 at opposite sides of the airflow guiding member 342 from each other, wherein each of the two airflow passages P1, P2 corresponds to one of the two airflow generating units 12a, 12b. At this time, the airflow generated by the two airflow generating units 12a, 12b will be separated by the airflow guiding member 342, so as to prevent the airflow noise generated by the two airflow generating units 12a, 12b from interfering with each other. Accordingly, the disclosure can achieve the effects of airflow adjustment and noise reduction to prevent the performance of the electronic unit 10 (as shown in FIG. 1) from being degraded by the airflow noise.

Furthermore, when one of the two airflow generating units 12a, 12b operates abnormally, the airflow generated by the two airflow generating units 12a, 12b will deflect to one side of the airflow guiding member 342. For example, when the airflow generating unit 12a operates abnormally, the airflow will deflect to the right side of the airflow guiding member 342 shown in FIG. 10. At this time, the moment caused by the pushing force of the airflow to the second blade 3424 at the right side cannot be balanced, such that the airflow guiding member 342 will rotate counterclockwise to the second position shown in FIG. 11. When the airflow guiding member 342 is located at the second position shown in FIG. 11, the first blade 3422 and the two second blades 3424 deflect, such that the two airflow passages P1, P2 communicate with each other. At this time, the airflow generated by the airflow generating unit 12b, which operates normally, may flow through the two airflow passages P1, P2 to dissipate heat from the electronic unit 10. Accordingly, the disclosure can prevent the heat dissipation efficiency from being greatly reduced due to the abnormal operation of the airflow generating unit 12a. Similarly, when the airflow deflects to the left side of the airflow guiding member 342 shown in FIG. 10, the airflow guiding member 342 will rotate clockwise to another second position opposite to the second position shown in FIG. 11, such that the two airflow passages P1, P2 communicate with each other.

As shown in FIGS. 8 to 11, an end of the rotating shaft 3420 may have a cam structure 3426 and the casing 340 may have a stop structure 3406. In this embodiment, the cam structure 3426 and the stop structure 3406 are located at a side of the upper plate 3400. In another embodiment, the cam structure 3426 and the stop structure 3406 may also be located at a side of the lower plate 3402. Furthermore, the stop structure 3406 may comprise two protrusions opposite to each other and the cam structure 3426 is disposed between the two protrusions. When the airflow guiding member 342 is located at the second position shown in FIG. 11, the stop structure 3406 will stop the cam structure 3426 to restrain the airflow guiding member 342 from rotating.

In this embodiment, a plurality of airflow guiding members 342 are disposed in the casing 340. In some embodiments, when one of the airflow guiding members 342 rotates to the second position due to the variation of the airflow, other airflow guiding members 342 may also rotate to the second position due to the variation of the airflow (as shown in FIG. 11), such that the airflow may be distributed to all of the electronic units 10 more uniformly.

As mentioned in the above, the invention disposes the airflow guiding member in the casing of the airflow guiding mechanism, wherein the airflow guiding member is able to rotate between the first position and the second position. When the airflow generating units operate normally, the airflow generated by the airflow generating units will uniformly flow through opposite sides of the airflow guiding member, such that the airflow guiding member is kept at the first position without rotating. When the airflow guiding member is located at the first position, the airflow guiding member separates the two airflow passages at opposite sides of the airflow guiding member from each other. At this time, the airflow generated by the airflow generating units will be separated by the airflow guiding member, so as to prevent the airflow noise generated by the airflow generating units from interfering with each other. Accordingly, the disclosure can achieve the effects of airflow adjustment and noise reduction to prevent the performance of the electronic unit from being degraded by the airflow noise. Furthermore, when one of the airflow generating units operates abnormally, the airflow generated by the airflow generating units will deflect to one side of the airflow guiding member. At this time, the airflow guiding member will rotate from the first position to the second position according to the variation of the airflow generated by the airflow generating units. When the airflow guiding member is located at the second position, the two airflow passages communicate with each other, such that the airflow generated by the airflow generating unit, which operates normally, may flow through the two airflow passages to dissipate heat from the electronic unit. Accordingly, the disclosure can prevent the heat dissipation efficiency from being greatly reduced due to the abnormal operation of the airflow generating unit.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An airflow guiding mechanism comprising:
   a casing; and
   an airflow guiding member comprising a rotating shaft, a first blade, a second blade and two third blades, the rotating shaft being pivotally connected to the casing, the first blade and the second blade being connected to opposite sides of the rotating shaft, the two third blades being connected to opposite sides of the rotating shaft, lengths of the two third blades in a radial direction of the rotating shaft being smaller than lengths of the first blade and the second blade in the radial direction of the rotating shaft;
   wherein, when the airflow guiding member is located at a first position, the first blade and the second blade separate two airflow passages at opposite sides of the airflow guiding member from each other; when the airflow guiding member is located at a second position, the two airflow passages communicate with each other through the two third blades.

2. The airflow guiding mechanism of claim 1, wherein a mass of the first blade is less than a mass of the second blade.

3. The airflow guiding mechanism of claim 1, wherein a length of the first blade in an axial direction of the rotating shaft is smaller than a length of the second blade in the axial direction of the rotating shaft.

4. The airflow guiding mechanism of claim 3, wherein the casing has a stop structure; when the airflow guiding member is located at the second position, the stop structure stops the second blade to restrain the airflow guiding member from rotating.

5. The airflow guiding mechanism of claim 1, wherein each of the two third blades has a curved surface and a flat surface, the curved surface faces a direction of the first blade, and the flat surface faces a direction of the second blade.

6. The airflow guiding mechanism of claim 1, further comprising a porous structure disposed at an air inlet side of the casing.

7. An electronic device comprising:
an electronic unit;
two airflow generating units disposed with respect to the electronic unit; and
an airflow guiding mechanism disposed between the electronic unit and the two airflow generating units, the airflow guiding mechanism comprising:
a casing; and
an airflow guiding member comprising a rotating shaft, a first blade, a second blade and two third blades, the rotating shaft being pivotally connected to the casing, the first blade and the second blade being connected to opposite sides of the rotating shaft, the two third blades being connected to opposite sides of the rotating shaft, lengths of the two third blades in a radial direction of the rotating shaft being smaller than lengths of the first blade and the second blade in the radial direction of the rotating shaft;
wherein, when the airflow guiding member is located at a first position, the first blade and the second blade separate two airflow passages at opposite sides of the airflow guiding member from each other; when the airflow guiding member is located at a second position, the two airflow passages communicate with each other through the two third blades; each of the two airflow passages corresponds to one of the two airflow generating units.

8. The electronic device of claim 7, wherein a mass of the first blade is less than a mass of the second blade.

9. The electronic device of claim 7, wherein a length of the first blade in an axial direction of the rotating shaft is smaller than a length of the second blade in the axial direction of the rotating shaft.

10. The electronic device of claim 9, wherein the casing has a stop structure; when the airflow guiding member is located at the second position, the stop structure stops the second blade to restrain the airflow guiding member from rotating.

11. The electronic device of claim 7, wherein each of the two third blades has a curved surface and a flat surface, the curved surface faces a direction of the first blade, and the flat surface faces a direction of the second blade.

12. The electronic device of claim 7, wherein the airflow guiding mechanism further comprises a porous structure disposed at an air inlet side of the casing and located between the electronic unit and the casing.

* * * * *